United States Patent [19]
Ito et al.

[11] 4,217,556
[45] Aug. 12, 1980

[54] OUTPUT AMPLIFYING CIRCUIT

[75] Inventors: Hideo Ito; Yoshihiro Kawanabe, both of Tokyo, Japan

[73] Assignee: Pioneer Electronic Corporation, Tokyo, Japan

[21] Appl. No.: 967,756

[22] Filed: Dec. 8, 1978

[30] Foreign Application Priority Data
Dec. 8, 1977 [JP] Japan .............................. 52-147643

[51] Int. Cl.² ............................................. H03F 3/21
[52] U.S. Cl. .................................. 330/268; 330/274; 330/297
[58] Field of Search ............... 330/199, 200, 202, 268, 330/274, 297

[56] References Cited
U.S. PATENT DOCUMENTS
4,115,739   9/1978   Sano et al. ...................... 330/297 X Primary Examiner—James B. Mullins
Attorney, Agent, or Firm—Sughrue, Rothwell, Mion, Zinn and Macpeak

[57] ABSTRACT

An output amplifying circuit which comprises a Push Pull amplifier section, a power supply circuit section and an amplifier section for amplifying a power source. The circuit eliminates an occurrence of switching distortion and minimizes heat loss therein. The input terminals of the Push Pull amplifier section and the power source amplifier section are connected in common, while the positive and the negative terminals of the power source amplifier section are connected to those of the power supply circuit section, respectively.

10 Claims, 1 Drawing Figure

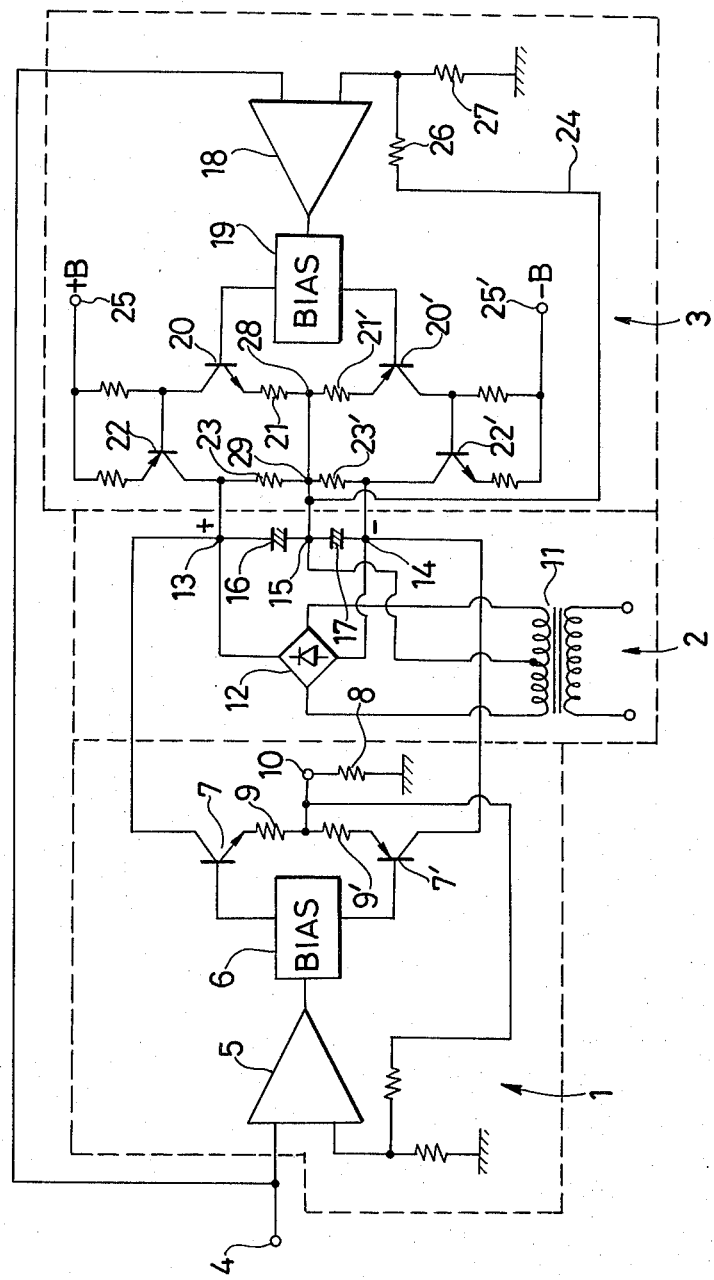

OUTPUT AMPLIFYING CIRCUIT

BACKGROUND OF THE INVENTION

This invention relates to an output amplifying circuit for use in audio equipment.

The output amplifying circuit is a so-called power amplifier in audio equipment. Heretofore, a variety of power amplifiers have been proposed, for example Class A or Class B Push Pull amplifiers (hereinafter referred to it merely as Class A, or Class B PP amplifier when applicable) is typical of such power amplifiers.

Provided in the Class A complementary PP amplifier are a pair of output transistors which are continuously operated in the unsaturated conductive state. Accordingly, these output transistors cannot shift their states from unsaturated conductive states to cut-off states, and therefore the Class A complementary PP amplifier is advantageous in that no switching distortion will occur. In this case, however, a well known disadvantage exists in that, since a relatively large biasing current is required, heat loss may become excessively large.

In contrast, the Class B complementary PP amplifier is advantageous in that, a biasing current is smaller than that of the aforementioned Class A complementary PP amplifier. As a result, the heat loss can be positively decreased. However, it has a disadvantage that the output transistors are alternately turned-on or turned-off. This causes the switching distortion to occur. Also, both the Class A and the Class B complementary PP amplifiers have antipodal characteristics.

SUMMARY OF THE INVENTION

In view of the foregoing, an object of the present invention is to eliminate the above mentioned drawbacks of the conventional Class A and Class B complementary PP amplifiers.

More specifically, it is another object of this invention to provide an improved output amplifying circuit capable of minimizing heat loss due to a relatively large biasing current and eliminating switching distortion.

The foregoing objects are accomplished by providing an output amplifying circuit which comprises a PP amplifier section, a power supply circuit section and an amplifier section for amplifying a power supply. The positive and the negative terminals of the power supply circuit section are respectively connected to those of the amplifier section in common to apply the sum of the outputs of the power supply section and the amplifier section, i.e., matched positive and negative power signals corresponding to the (+) and (−) sections of sound signal, to the PP amplifier section.

BRIEF DESCRIPTION OF THE DRAWING

The single FIGURE is a circuit diagram illustrating an output amplifying circuit according to the present invention.

DETAILED DESCRIPTION OF THE PREFERRED EMBODIMENT

One preferred embodiment of the present invention will be described with reference to the accompanying FIGURE.

Turning now to the FIGURE, an output amplifying circuit according to the present invention comprises a PP amplifier section 1, a power supply circuit section 2 and an amplifier section 3 for amplifying a power source. Each of these sections is encircled by a dotted line.

As is well-known in the art, the PP amplifier section 1 comprises a voltage amplifier 5, a biasing circuit 6 and a pair of output transistors 7 and 7'. An input signal from an input terminal 4 which is commonly used to the power amplifier section 3 described in detail hereinafter, is fed through the voltage amplifier 5 to the biasing circuit 6. Then the outputs of the biasing circuit 6 are applied to the respective bases of the paired output transistors 7 and 7'. The transistors 7 and 7' are connected to each other in a complementary arrangement, so that the emitters of the paired transistors 7 and 7' are connected through a series connection of resistors 9 and 9'. An output terminal 10 grounded through a load 8, is connected to the junction between the resistors 9 and 9'.

The power supply circuit section 2 comprises a power source transformer 11, a rectifier 12 and power source capacitors 16 and 17. The secondary coil of the transformer is connected across the rectifier 12 and positive and negative output terminals 13 and 14 are connected together through a series connection of the power source capacitors 16 and 17. The terminals 13 and 14 are connected across the rectifier 12. Furthermore, the output terminals 13 and 14 are connected to the collectors of the output transistors 7 and 7' included in the above mentioned PP amplifier section 1, respectively. The junction 15 between the power source capacitors 16 and 17 is connected to the midpoint of the secondary coil of the transformer 11.

The amplifier section 3 has almost the same circuit construction as the PP amplifier section 1. In the amplifier section 3, an input signal from the common input terminal 4 is fed through a voltage amplifier 18 to a biasing circuit 19. Then the outputs of the biasing circuit 19 are applied to the respective bases of transistors 20 and 20'. These transistors 20 and 20' are connected to each other in a complementary arrangement, so that the emitters are connected through a series connection of resistors 21 and 21'.

The collectors of the transistors 20 and 20' are connected not only to power source terminals 25 and 25' but also to the bases of a pair of transistors 22 and 22', respectively. The emitters of the transistors 22 and 22' are also connected to the power source terminals 25 and 25', while the collectors thereof are connected to the output terminals 13 and 14 of the power supply circuit section 2. The collectors are also connected to each other through a series connection of resistors 23 and 23'. The junction 29 between the resistors 23 and 23' is connected to both the junction 15 between the power source capacitors 16 and 17 and to the junction 28 between the resistors 21 and 21'. In addition, a feed-back circuit 24 comprising feed-back resistors 26 and 27 is provided in the amplifier section 3. The voltage appearing at the terminal 15 is subjected to voltage division by the resistors 26 and 27 and then the divided voltage is fed-back to the voltage amplifier 18. The same feed-back circuit is employed in the PP section 1.

In operation of the assembled output amplifying circuit, the pair of transistors 20 and 20' and the pair of transistors 22 and 22' in the amplifier section 3 are controlled in their states by an input signal from the input terminal 4, which is also common to an input signal of the PP amplifier section 1. As a result, the power supply circuit section 2 provides matched positive and negative power corresponding to the (+) and (−) sections of the input signal, i.e., the sum of the outputs from the power supply circuit section 2 and the amplifier section 3, to the collectors of output transistors 7 and 7' of the PP amplifier section 1 to obtain the output at the output terminal 10 of the PP amplifier section 1.

In this case, the biasing circuit 6 controls the output transistors 7 and 7', so that the output transistors 7 and 7' always operate in unsaturated conductive states as set forth in a Class A PP amplifier. The output voltage of the power supply circuit section 2 is predetermined to be a value lower than that of the conventional power supply circuit. Furthermore, in the amplifier section 3, the transistors 22 and 22' are controlled by a relatively small biasing current and the power supply voltage ±B is set at a voltage enough to drive the load 8 in the PP amplifier section 1.

Moreover, the resistance values of the resistors 26 and 27 in the feed-back circuit 24 are predetermined, so that the gain of the PP amplifier section 1 is equal to that of the amplifier section 3. Accordingly, assuming that the output signal which appears at the output terminal 10 has a positive polarity in response to the input signal, the output signal of the amplifier section 3 has also the same polarity. Hence the output transistor 7 is not saturated within the output range defined by the power supply voltage +B. On the other hand, assuming that the output signal at the output terminal 10 has a negative polarity in response thereto, the output signal of the amplifier section 3 has also the same polarity. Accordingly the output transistor 7' is not saturated within the output range defined by the power supply voltage −B. Consequently, it is possible to always make the output transistors 7 and 7' of the PP amplifier section 1 operate in unsaturated conductive states within the applied voltage range defined by the power supply voltage ±B.

In addition, the voltage which is applied from the power supply circuit 2 to the output transistors 7 and 7', can be set as small as possible. As is apparent from the above description, according to the present invention, there is no possibility that the output transistors 7 and 7' will shift their states from unsaturated conductive states to cut-off states.

Therefore, switching distortion due to the shifting of state of output transistor as set forth in Class B amplifiers will not occur. Furthermore, the present output amplifying circuit can make the applied voltage from a power supply circuit lower than that in the conventional amplifiers to thereby decrease the heat loss in the output amplifying circuit.

It is apparent that modifications of the present invention are possible without departing from the essential scope thereof.

What is claimed is:

1. In an output amplifying circuit having a Push Pull amplifier section, a power supply circuit section coupled to the Push Pull amplifier and an amplifier circuit section for amplifying a power supply, the improvement comprising; said power supply circuit section and said amplifier circuit section being connected in parallel and having respective positive and negative terminals connected in common wherein the sum of the outputs corresponding to positive and negative sections of an input signal and the power supply are applied to said Push Pull amplifier section.

2. The output amplifying circuit of claim 1 wherein said Push Pull amplifier section comprises a voltage amplifier, a biasing circuit receiving the output of said voltage amplifier and a pair of output transistors receiving the output of said biasing circuit.

3. The output amplifying circuit of claim 2 wherein an output terminal is coupled between the emitters of said output transistors.

4. The output amplifying circuit of claims 1 or 2 wherein said power supply circuit section comprises a power source transformer having primary and secondary coils, a rectifier coupled across said secondary coil and a pair of power source capacitors.

5. The output ampifying circuit of claim 4 wherein said positive and negative output terminals of said power supply circuit are coupled in a series connection with said power source capacitors and are coupled to said Push Pull amplifier section.

6. The output amplifying circuit of claim 5 further comprising a junction between said power source capacitors coupled to the center tap of said secondary coil.

7. The output amplifying circuit of claim 4 wherein said amplifier section comprises a voltage amplifier, a biasing circuit receiving the output of said voltage amplifier, a first pair of transistors receiving the output of said biasing circuit and a second pair of transistors coupled to said first pair of transistors.

8. The output amplifying circuit of claim 7 wherein the respective collectors of said first pair of transistors are coupled to the respective bases of said second pair of transistors.

9. The output amplifying circuit of claim 8 wherein the collectors of said second pair of transistors form the positive and negative output of said amplifier circuit section, said collectors being coupled to corresponding common polarity outputs of said power supply circuit section.

10. The output amplifying circuit of claim 1 wherein said power supply circuit comprises means for supplying a supply voltage to a pair of power source capacitors with said positive and negative output terminals coupled to said capacitors and said Push Pull amplifier circuit section comprises a pair of output transistors having their collectors coupled to said positive and negative output terminals.

* * * * *